(12) United States Patent
Chen et al.

(10) Patent No.: US 10,923,877 B2
(45) Date of Patent: Feb. 16, 2021

(54) SURFACE-MOUNT LASER APPARATUS AND OUTPUT OPTICAL POWER MONITORING METHOD

(71) Applicant: HUAWEI TECHNOLOGIES CO., LTD., Guangdong (CN)

(72) Inventors: Kaisheng Chen, Wuhan (CN); Hongmin Chen, Santa Clara, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 276 days.

(21) Appl. No.: 15/855,334

(22) Filed: Dec. 27, 2017

(65) Prior Publication Data

US 2018/0191128 A1 Jul. 5, 2018

(30) Foreign Application Priority Data

Dec. 29, 2016 (CN) .......................... 201611249152.0

(51) Int. Cl.
| | |
|---|---|
| *G02B 6/42* | (2006.01) |
| *H01S 5/026* | (2006.01) |
| *H01S 5/10* | (2021.01) |
| *H01S 5/02* | (2006.01) |
| *H01S 5/022* | (2021.01) |

(Continued)

(52) U.S. Cl.
CPC ........ *H01S 5/0264* (2013.01); *G02B 6/12004* (2013.01); *G02B 6/125* (2013.01); *G02B 6/4286* (2013.01); *G02B 6/4295* (2013.01); *H01S 5/0042* (2013.01); *H01S 5/021* (2013.01); *H01S 5/0224* (2013.01); *H01S 5/02248* (2013.01); *H01S 5/0683* (2013.01); *H01S 5/1032* (2013.01); *G02B 2006/12097* (2013.01); *G02B 2006/12121* (2013.01); *G02B 2006/12123* (2013.01); *H01S 5/02272* (2013.01); *H01S 5/0617* (2013.01)

(58) Field of Classification Search
None
See application file for complete search history.

(56) References Cited

U.S. PATENT DOCUMENTS

| | | | |
|---|---|---|---|
| 6,714,566 B1 | 3/2004 | Coldren et al. | |
| 6,917,636 B2 * | 7/2005 | Blauvelt | H01S 5/026 |
| | | | 372/102 |

(Continued)

FOREIGN PATENT DOCUMENTS

| | | |
|---|---|---|
| CN | 106058641 A | 10/2016 |
| GB | 2353898 A | 3/2001 |

OTHER PUBLICATIONS

Chinese Office Action issued in Chinese Application No. 201611249152 dated Feb. 26, 2019, 15 pages.

(Continued)

*Primary Examiner* — Chad H Smith
(74) *Attorney, Agent, or Firm* — Fish & Richardson P.C.

(57) ABSTRACT

Embodiments of the present disclosure relate to a surface-mount laser apparatus. One example apparatus includes an on-chip laser, a passive waveguide, and a waveguide detector. The waveguide detector includes a first ridge waveguide. The on-chip laser includes a second ridge waveguide. The on-chip laser is coupled with the passive waveguide by the second ridge waveguide, and the waveguide detector is coupled with the passive waveguide by the first ridge waveguide.

7 Claims, 4 Drawing Sheets

(51) Int. Cl.
*H01S 5/00* (2006.01)
*H01S 5/0683* (2006.01)
*G02B 6/12* (2006.01)
*G02B 6/125* (2006.01)
*H01S 5/06* (2006.01)

(56) References Cited

U.S. PATENT DOCUMENTS

| | | |
|---|---|---|
| 7,599,585 B2 | 10/2009 | Blauvelt et al. |
| 9,356,419 B1 | 5/2016 | Orcutt |
| 2003/0081902 A1* | 5/2003 | Blauvelt ................ G02B 6/125 385/50 |
| 2004/0131302 A1* | 7/2004 | Kouta ........................ G01J 1/04 385/14 |
| 2013/0202005 A1 | 8/2013 | Dutt et al. |
| 2016/0301185 A1 | 10/2016 | Orcutt |

OTHER PUBLICATIONS

Kazuya Ohira et al: "On-chip optical interconnection by using integrated III-V laser diode and photodetector with silicon waveguide", Optics Express, vol. 18, No. 15, Jul. 19, 2010, XP055477383, 8 pages.
Extended European Search Report issued in European Application No. 17210779.9 dated Jun. 1, 2018, 9 pages.

\* cited by examiner

SURFACE-MOUNT LASER APPARATUS AND OUTPUT OPTICAL POWER MONITORING METHOD

CROSS-REFERENCE TO RELATED APPLICATION

This application claims priority to Chinese Patent Application No. 201611249152.0, filed on Dec. 29, 2016, which is hereby incorporated by reference in its entirety.

TECHNICAL FIELD

The present invention relates to the field of photoelectric technologies, and in particular, to a surface-mount laser apparatus and an output optical power monitoring method.

BACKGROUND

Photonic integration is a development trend of photoelectric technologies, and is expected to greatly reduce costs of a photonic system and improve performance of the photonic system. Monolithic integration and hybrid integration are two effective methods for implementing photonic integration. In monolithic integration, optical devices with different functions are fabricated on a same substrate (for example, an indium phosphide (InP) substrate) and are interconnected. In hybrid integration, different optical devices are fabricated by using appropriate material systems, integrated by means of pressure welding, bonding, or the like to form different devices, and optically interconnected by means of passive coupling. Because the different optical devices can be fabricated by using respective appropriate materials and relatively mature technologies, hybrid integration is characterized by high flexibility and low costs. In hybrid integration, most of the optical devices, such as a passive waveguide, an MMI coupler, and a modulator, can use a silicon (Si) optical platform that has low costs and that is fabricated by using a relatively mature technology (which is compatible with a complementary metal oxide semiconductor (COMS) technology). However, Si is an indirect band gap material and has low luminous efficiency. Therefore, Si is not suitable for fabricating a light source. III-V materials can be used for fabricating an efficient light source, and various types of III-V lasers, such as a Fabry-Perot (FP) laser, a distributed feedback (DFB) laser, and a distributed Bragg reflector (DBR) laser, all are successfully commercialized for many years.

A typical method for implementing hybrid integration of a III-V laser and a Si optical device is using a flip-chip bonding technology, that is, directly attaching a fabricated surface-mount laser apparatus upside down to the Si optical device, to allow metal bonding pads of the laser apparatus and the Si optical device to be in contact with each other; and welding the laser to the Si optical device by means of heating to melt the metal bonding pads and cooling the metal bonding pads.

For an existing surface-mount laser apparatus, a laser is generally fabricated on a semiconductor substrate, and a passive waveguide made of another material is monolithically integrated behind the laser by using a technology such as selective etching, so that light from the laser is directly coupled into the passive waveguide for output or coupled into another optical device.

However, during application, the existing surface-mount laser apparatus needs to use an external detector to monitor an output optical power of the laser, to implement locking of the output optical power of the device. This increases complexity of a light path of a planar lightwave circuit (PLC), a Si optical device, or another chip, and increases device costs.

SUMMARY

Embodiments of the present invention provide a surface-mount laser apparatus and an output optical power monitoring method, so as to reduce light path complexity and costs of a device.

In view of this, a first aspect of the embodiments of the present invention provides a surface-mount laser apparatus, including an on-chip laser, a passive waveguide, and a waveguide detector, where the waveguide detector includes a first ridge waveguide, and the on-chip laser includes a second ridge waveguide;

the on-chip laser is connected to the passive waveguide by means of coupling by using the second ridge waveguide; and the waveguide detector is connected to the passive waveguide by means of coupling by using the first ridge waveguide.

The surface-mount laser apparatus provided in the embodiments of the present invention includes the on-chip laser, the passive waveguide, and the waveguide detector. The waveguide detector includes the first ridge waveguide, and the on-chip laser includes the second ridge waveguide. The on-chip laser is connected to the passive waveguide by means of coupling by using the second ridge waveguide, and the waveguide detector is connected to the passive waveguide by means of coupling by using the first ridge waveguide. The surface-mount laser apparatus in the embodiments of the present invention is provided with the waveguide detector and does not require an external detector to implement locking of an output optical power, thereby reducing light path complexity and costs of a device.

With reference to the first aspect of the embodiments of the present invention, in a first implementation of the first aspect of the embodiments of the present invention, the on-chip laser is configured to output test light, the passive waveguide is configured to transmit the test light into the waveguide detector, and the waveguide detector is configured to determine a photocurrent corresponding to the test light.

The waveguide detector in the embodiments of the present invention has detected the photocurrent of the test light output from the on-chip laser. According to the photocurrent, it can be determined whether an output power of the on-chip laser meets a criterion, that is, testing can be performed on a wafer to identify an unqualified surface-mount laser apparatus, thereby simplifying detection operations and reducing costs.

With reference to the first aspect of the embodiments of the present invention, in the second implementation of the first aspect of the embodiments of the present invention, the waveguide detector further includes an electrode, and the electrode is configured to connect to a bonding pad on a base board;

the on-chip laser is configured to output test light;

the passive waveguide is configured to: split the test light into first test light and second test light, couple the first test light into an optical waveguide of the base board by using an evanescent wave, and couple the second test light into the waveguide detector, where optical energy of the first test light is higher than optical energy of the second test light; and the waveguide detector is configured to determine a photocurrent corresponding to the second test light, where the photocurrent is corresponding to a target optical power, and the target optical power is an optical power, detected after the first test light is output from the optical waveguide of the base board, of the first test light.

The passive waveguide in the embodiments of the present invention can split the test light into the first test light and the second test light, couple the first test light into the optical waveguide of the base board for output, and couple the second test light into the waveguide detector. The optical power of the output first test light can be detected by using an external device, the optical power is allowed to be corresponding to the photocurrent, detected by the waveguide detector, of the second test light, and locking of the output optical power of a device can be implemented according to the correspondence.

With reference to the second implementation of the first aspect of the embodiments of the present invention, in a third implementation of the first aspect of the embodiments of the present invention, the first ridge waveguide is covered by metal, and the metal is used as an electrode of the waveguide detector.

The embodiments of the present invention provide a specific electrode form, so as to improve implementability of the solution.

With reference to the first aspect of the embodiments of the present invention, in a fourth implementation of the first aspect of the embodiments of the present invention, the waveguide detector further includes a deeply etched cavity surface.

The embodiments of the present invention provide a specific manner for fabricating the cavity surface of the waveguide detector, so as to improve implementability of the solution.

With reference to the fourth implementation of the first aspect of the embodiments of the present invention, in a fifth implementation of the first aspect of the embodiments of the present invention, the deeply etched cavity surface is covered by a dense substance with a preset thickness.

The waveguide detector in the embodiments of the present invention is covered by a dense substance, thereby preventing the waveguide detector from being oxidized and damaged.

With reference to the fourth implementation of the first aspect of the embodiments of the present invention, in a sixth implementation of the first aspect of the embodiments of the present invention, the deeply etched cavity surface is a straight surface or an arc surface.

The embodiments of the present invention provide multiple specific shapes of the deeply etched cavity surface, so as to improve flexibility of the solution.

With reference to any one of the first aspect of the embodiments of the present invention or the first to the sixth implementations of the first aspect, in a seventh implementation of the first aspect of the embodiments of the present invention, an included angle between the first ridge waveguide of the waveguide detector and the second ridge waveguide of the on-chip laser is within a preset range; and the passive waveguide includes a curved waveguide.

The passive waveguide in the embodiments of the present invention may be curved, and the waveguide detector may be placed obliquely, so as to improve flexibility of the solution.

A second aspect of the embodiments of the present invention provides an output optical power monitoring method of a surface-mount laser apparatus, where the surface-mount laser apparatus includes an on-chip laser, a passive waveguide, and a waveguide detector, and the method includes: outputting, by the on-chip laser, test light; inputting, by the passive waveguide, the test light into the waveguide detector; and determining, by the waveguide detector, a photocurrent corresponding to the test light, where the photocurrent is used to determine whether an output power of the on-chip laser meets a criterion.

The surface-mount laser apparatus in the embodiments of the present invention can perform testing on a wafer by using the waveguide detector disposed in the surface-mount laser apparatus, to obtain current data that represents the output optical power of the on-chip laser, thereby identifying an unqualified surface-mount laser apparatus, simplifying operations, and reducing costs.

A third aspect of the embodiments of the present invention provides another output optical power monitoring method of a surface-mount laser apparatus, where the surface-mount laser apparatus includes an on-chip laser, a passive waveguide, and a waveguide detector, and the method includes: establishing a connection between the surface-mount laser apparatus and a base board; outputting, by the on-chip laser in the surface-mount laser apparatus, test light; splitting, by the passive waveguide in the surface-mount laser apparatus, the test light into first test light and second test light, coupling the first test light into an optical waveguide of the base board by using an evanescent wave, and coupling the second test light into the waveguide detector, where optical energy of the first test light is higher than optical energy of the second test light; and determining, by the waveguide detector in the surface-mount laser apparatus, a photocurrent corresponding to the second test light, where the photocurrent is corresponding to a target optical power, and the target optical power is an optical power, detected after the first test light is output from the optical waveguide of the base board, of the first test light.

After being connected to the base board, the surface-mount laser apparatus in the embodiments of the present invention can detect a photocurrent of a portion of the test light by using the waveguide detector disposed in the surface-mount laser apparatus, and establish a correspondence between the photocurrent and an optical power of the other portion of the test light that is output from the optical waveguide. During subsequent use of the surface-mount laser apparatus, an operating current of the on-chip laser is adjusted according to the correspondence and the photocurrent that is detected by the waveguide detector in real time, so that an accurate and stable output optical power can be output, implementing locking of the output optical power of a device.

It can be learned from the foregoing technical solutions, the embodiments of the present invention have the following advantages.

The surface-mount laser apparatus provided in the embodiments of the present invention includes the on-chip laser, the passive waveguide, and the waveguide detector. The waveguide detector includes the first ridge waveguide, and the on-chip laser includes the second ridge waveguide. The on-chip laser is connected to the passive waveguide by means of coupling by using the second ridge waveguide, and the waveguide detector is connected to the passive waveguide by means of coupling by using the first ridge waveguide. The surface-mount laser apparatus in the embodiments of the present invention is provided with the waveguide detector and does not require an external detector to implement locking of an output optical power, thereby reducing light path complexity and costs of a device.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention.

In the specification, claims, and accompanying drawings of the present invention, the terms "first", "second", "third", "fourth", and the like (if existent) are intended to distinguish between similar objects but do not necessarily indicate a specific order or sequence. It should be understood that the data termed in such a way are interchangeable in proper circumstances so that the embodiments of the present invention described herein can be implemented in orders except the order illustrated or described herein. Moreover, the terms "include", "contain" and any other variants mean to cover the non-exclusive inclusion, for example, a process, method, system, product, or device that includes a list of steps or units is not necessarily limited to those steps or units, but may include other steps or units not expressly listed or inherent to such a process, method, system, product, or device.

The embodiments of the present invention provide a surface-mount laser apparatus and an output optical power monitoring method, so as to reduce light path complexity and costs of a device.

Figure 1:
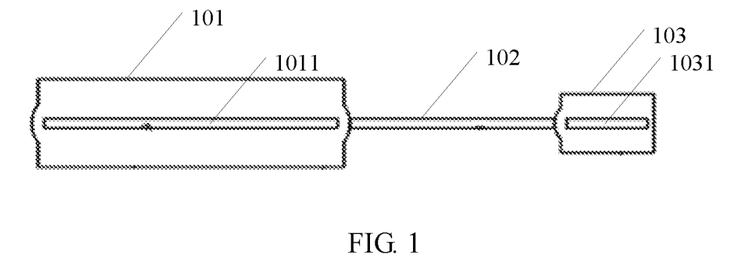
FIG. 1 is a schematic diagram of an embodiment of a surface-mount laser apparatus according to the embodiments of the present invention.

The following first describes the surface-mount laser apparatus in the embodiments of the present invention. Referring to FIG. 1, an embodiment of the surface-mount laser apparatus in the embodiments of the present invention includes an on-chip laser 101, a passive waveguide 102, and a waveguide detector 103.

The waveguide detector 103 includes a first ridge waveguide 1031, and the on-chip laser 101 includes a second ridge waveguide 1011.

The on-chip laser 101 is connected to the passive waveguide 102 by means of coupling by using the second ridge waveguide 1011.

The waveguide detector 103 is connected to the passive waveguide 102 by means of coupling by using the first ridge waveguide 1031.

It should be understood that, in this embodiment of the present invention, a fabrication technology and a material required by the waveguide detector 103 may be the same as or may be different from a fabrication technology and a material required by the on-chip laser 101, no limitation is set herein. Specifically, during fabrication of the foregoing surface-mount laser apparatus, first the on-chip laser 101 and the waveguide detector 103 may be simultaneously fabricated on a substrate, cavity surfaces of the on-chip laser 101 and the waveguide detector 103 are fabricated by using a semiconductor technology, and then the passive waveguide 102 made of a material whose refractive index is less than a refractive index of the substrate is fabricated between the on-chip laser and the waveguide detector. Certainly, the foregoing surface-mount laser apparatus can alternatively be fabricated in another manner, and no specific limitation is set herein.

The surface-mount laser apparatus provided in this embodiment of the present invention includes the on-chip laser, the passive waveguide, and the waveguide detector. The waveguide detector includes the first ridge waveguide, and the on-chip laser includes the second ridge waveguide. The on-chip laser is connected to the passive waveguide by means of coupling by using the second ridge waveguide, and the waveguide detector is connected to the passive waveguide by means of coupling by using the first ridge waveguide. The surface-mount laser apparatus in this embodiment of the present invention is provided with the waveguide detector and does not require an external detector to implement locking of an output optical power, thereby reducing light path complexity and costs of a device.

A surface-mount laser apparatus in the prior art can measure spectral information at a wafer level by using leakage light, but cannot measure an output optical power. An only manner is as follows: The surface-mount laser apparatus is welded to a PLC and packaged to form a device, and an output optical power of the device is tested. Interception cannot be performed at a chip level, and if the apparatus becomes invalid, the entire device needs to be discarded, causing high costs and relatively low testing efficiency.

Based on the foregoing embodiment corresponding to FIG. 1, in another embodiment of the surface-mount laser apparatus provided in the embodiments of the present invention, the waveguide detector further includes an electrode. During wafer-level testing, a probe is made to be in contact with the electrode of the waveguide detector to perform photocurrent testing. In this case, the on-chip laser is configured to output test light, the passive waveguide is configured to transmit the test light into the waveguide detector, and the waveguide detector is configured to determine a photocurrent corresponding to the test light.

It should be understood that because a loss of the test light is generated due to butt-coupling, the test light output from the laser in this embodiment of the present invention cannot be totally coupled into the waveguide detector, and there is a deviation between a theoretical optical power corresponding to the photocurrent tested by the waveguide detector and an actual optical power of the test light output from the on-chip laser, so the theoretical optical power cannot be used as an absolute measurement criterion of the output optical power of the on-chip laser. However, in this embodiment of the present invention, the photocurrent detected by the waveguide detector can be used to determine whether the output power of the on-chip laser meets a criterion. Specifically, a qualified photocurrent value may be set according to experimental data. When a value of the photocurrent detected by the detector is less than the qualified photocurrent value that is set, it is considered that the surface-mount laser apparatus does not meet a criterion.

The waveguide detector in this embodiment of the present invention can detect the photocurrent of the test light output from the on-chip laser. According to the photocurrent, it can be determined whether the output power of the on-chip laser meets the criterion, that is, testing can be performed on a wafer to screen out an unqualified surface-mount laser apparatus, thereby simplifying detection operations and reducing costs. The surface-mount laser apparatus in this embodiment of the present invention can implement output optical power measurement at a wafer level. Specifically, referring to FIG. 2, another embodiment of the surface-mount laser apparatus according to the embodiments of the present invention includes an on-chip laser 201, a passive waveguide 202, and a waveguide detector 203.

Figure 2:
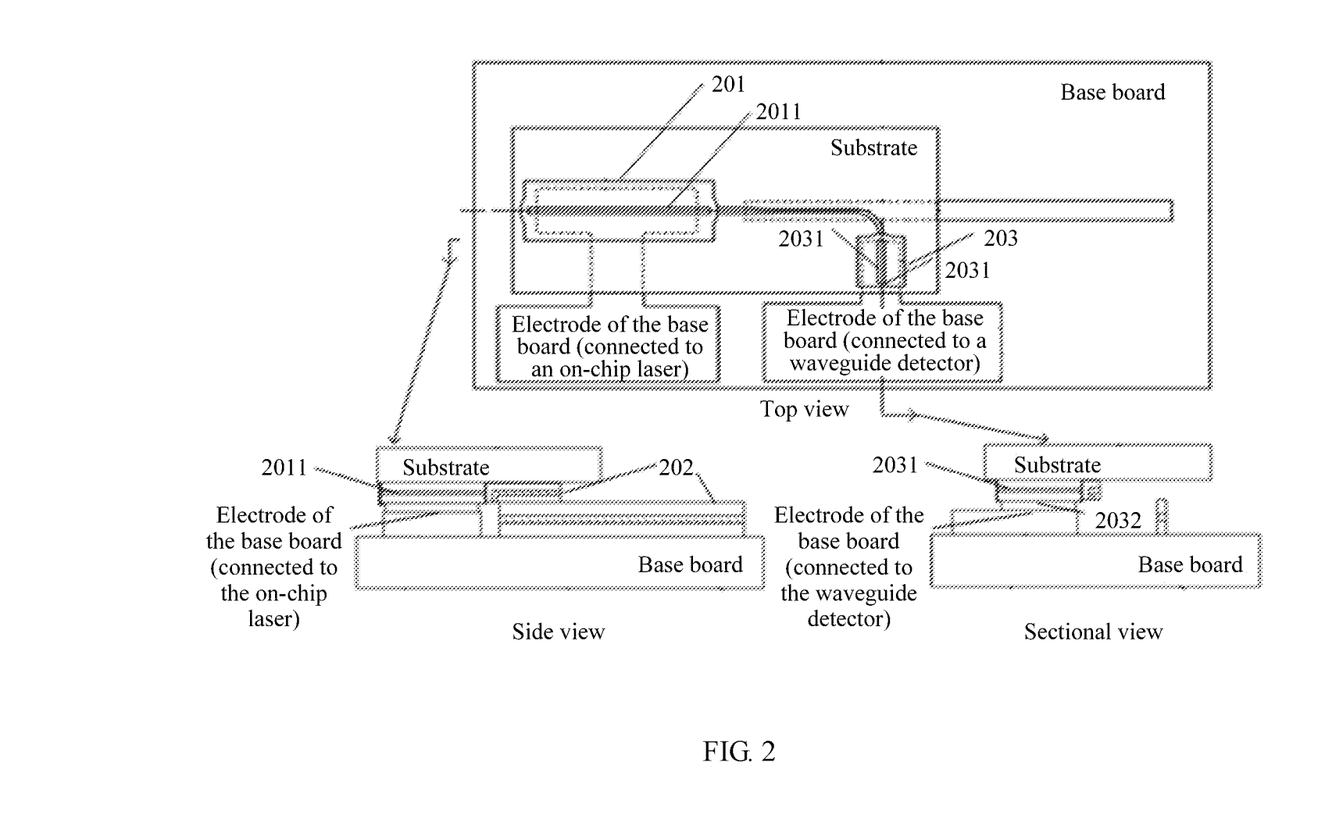
FIG. 2 is a schematic diagram of another embodiment of a surface-mount laser apparatus according to the embodiments of the present invention.

The waveguide detector 203 includes a first ridge waveguide 2031 and an electrode 2032, and the on-chip laser 201 includes a second ridge waveguide 2011.

The on-chip laser 201 is connected to the passive waveguide 202 by means of coupling by using the second ridge waveguide 2011.

The waveguide detector 203 is connected to the passive waveguide 202 by means of coupling by using the first ridge waveguide 2031.

The electrode 2032 of the waveguide detector 203 is configured to connect a bonding pad on a base board.

The foregoing surface-mount laser may be attached to the base board by means of flip-chip bonding, and the base board may be a PLC, may be a Si optical device, or may be another base board including an optical waveguide or a chip, and no specific limitation is set herein. Specifically, an electrode of the on-chip laser 201 may be directly welded to an electrode that is on the base board and that is connected to the laser. Similarly, the electrode 2032 of the waveguide detector 203 is directly welded to an electrode that is on the base board and that is connected to the waveguide detector. An external circuit provides a positive bias voltage to the on-chip laser 201 by using the electrode on the base board, while the waveguide detector 203 operates in a negative bias state. In this case, the on-chip laser 201 outputs test light, and the test light is butt-coupled into the passive waveguide 202. The passive waveguide 202 splits the test light into first test light and second test light, couples the first test light into an optical waveguide of the base board by using an evanescent wave, and couples the second test light into the waveguide detector 203. It should be understood that after the first test light is coupled into the optical waveguide of the base board, the first test light can be coupled and output by using an optical fiber or a lens or in another manner, and an optical power of the output first test light is detected by using a device such as a power meter. After the second test light is coupled into the waveguide detector 203, the waveguide detector 203 detects a photocurrent corresponding to the second test light, and the photocurrent is corresponding to the foregoing detected optical power. During subsequent use of the surface-mount laser apparatus, an operating current of the laser can be adjusted according to a relationship between the photocurrent and the optical power and according to the photocurrent detected by the waveguide detector in real time, so that an accurate and stable output optical power is output.

It should be understood that a ratio of optical energy of the first test light to optical energy of the second test light depends on a slope, a width, or another parameter of the passive waveguide, that is, a split ratio used during evanescent wave coupling may be controlled by designing a parameter of the passive waveguide 202. The split ratio used during evanescent wave coupling is the ratio of the optical energy of the first test light to the optical energy of the second test light. In actual application, the optical energy ratio is relatively high, that is, a quite large portion of the test light is coupled into the optical waveguide of the base board, and the rest small portion of the light is coupled into the waveguide detector 203. Specifically, the split ratio is set to 95:5. Certainly, the split ratio may be another ratio, and no specific limitation is set herein.

The surface-mount laser apparatus provided in this embodiment of the present invention includes the on-chip laser, the passive waveguide, and the waveguide detector. The waveguide detector includes the first ridge waveguide, and the on-chip laser includes the second ridge waveguide. The on-chip laser is connected to the passive waveguide by means of coupling by using the second ridge waveguide, and the waveguide detector is connected to the passive waveguide by means of coupling by using the first ridge waveguide. The surface-mount laser apparatus in this embodiment of the present invention is provided with the waveguide detector and does not require an external detector to implement locking of an output optical power, thereby reducing light path complexity and costs of a device.

In addition, the waveguide detector in this embodiment of the present invention can be connected to the base board. Light generated by the on-chip laser is split by using the passive waveguide, one portion of the light is output through the optical waveguide on the base board, and an optical power of the portion of the light is tested; and the other portion of the light is coupled into the waveguide detector, and a photocurrent of the other portion of the light is measured. A relationship between the photocurrent and the optical power is established, so that locking of the output optical power can be implemented without using an external detector. A specific manner of locking the output optical power is provided, so as to improve implementability of the solution.

Figure 3:
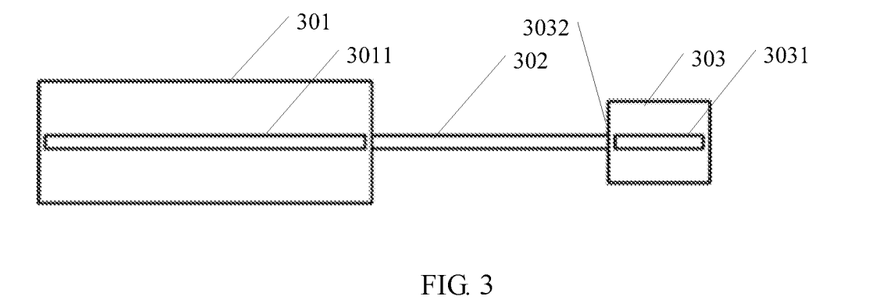
FIG. 3 is a schematic diagram of another embodiment of a surface-mount laser apparatus according to the embodiments of the present invention.
Figure 4:
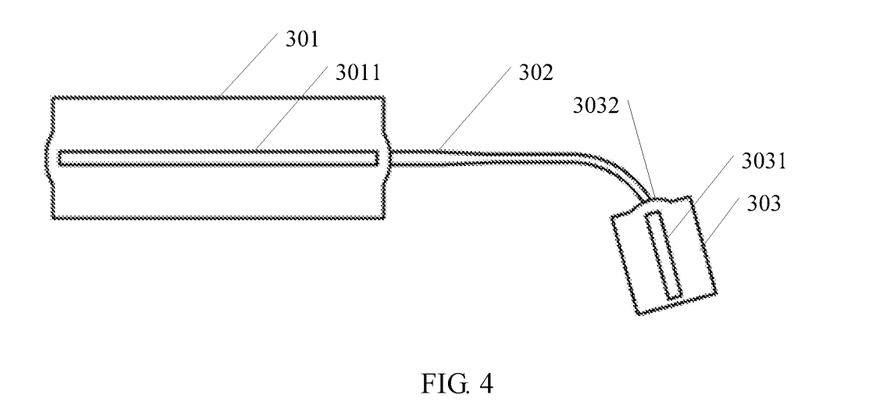
FIG. 4 is a schematic diagram of another embodiment of a surface-mount laser apparatus according to the embodiments of the present invention.

It can be learned from the embodiment corresponding to FIG. 1 or FIG. 2, a cavity surface of the waveguide detector may be fabricated by using multiple semiconductor technologies. The following describes the surface-mount laser apparatus in the embodiments of the present invention in detail by using one of the semiconductor technologies as an example. Referring to FIG. 3 and FIG. 4, another embodiment of the surface-mount laser apparatus in the embodiments of the present invention includes:

an on-chip laser 301, a passive waveguide 302, and a waveguide detector 303.

The waveguide detector 303 includes a first ridge waveguide 3031 and a deeply etched cavity surface 3032, and the on-chip laser 301 includes a second ridge waveguide 3011.

The on-chip laser 301 is connected to the passive waveguide 302 by means of coupling by using the second ridge waveguide 3011.

The waveguide detector 303 is connected to the passive waveguide 302 by means of coupling by using the first ridge waveguide 3031.

In this embodiment of the present invention, the cavity surface of the waveguide detector may be fabricated by using a deep etching technology.

Optionally, in this embodiment of the present invention, the deeply etched cavity surface of the waveguide detector may be covered by a dense substance with a preset thickness. The dense substance may be silicon dioxide or another substance, and no specific limitation is set herein. The preset thickness may be one micrometer or another value, and no specific limitation is set herein.

It should be understood that in this embodiment of the present invention, the deeply etched cavity surface of the waveguide detector may be a straight surface, such as a deeply etched cavity surface 3032 shown in FIG. 3, or may be an arc surface, such as a deeply etched cavity surface 3032 shown in FIG. 4. No specific limitation is set herein.

It should be understood that in this embodiment of the present invention, the passive waveguide may be a straight waveguide, which is perpendicular to the deeply etched cavity surface, as shown in FIG. 3. The passive waveguide may alternatively be not perpendicular to the deeply etched cavity surface and includes a section of curved waveguide; correspondingly, an included angle between the first ridge waveguide of the waveguide detector and the second ridge waveguide of the on-chip laser may be within a preset range and may specifically range from 7 degrees to 90 degrees, as shown in FIG. 4.

The surface-mount laser apparatus provided in this embodiment of the present invention includes the on-chip laser, the passive waveguide, and the waveguide detector. The waveguide detector includes the first ridge waveguide, and the on-chip laser includes the second ridge waveguide. The on-chip laser is connected to the passive waveguide by means of coupling by using the second ridge waveguide, and the waveguide detector is connected to the passive waveguide by means of coupling by using the first ridge waveguide. The surface-mount laser apparatus in this embodiment of the present invention is provided with the waveguide detector and does not require an external detector to implement locking of an output optical power, thereby reducing light path complexity and costs of a device.

In addition, in this embodiment of the present invention, the cavity surface of the waveguide detector may be fabricated by using a deep etching technology, and the dense substance may be covered on the cavity surface, so that air can be effectively isolated, thereby implementing nonhermetic packaging and preventing the cavity surface from being oxidized.

Moreover, the passive waveguide in this embodiment of the present invention may be perpendicular to the deeply etched cavity surface, or may not be perpendicular to the deeply etched cavity surface, so that a specific included angle is formed between the first ridge waveguide and the second ridge waveguide, thereby improving flexibility of the solution.

Based on the foregoing multiple embodiments, the following describes the surface-mount laser apparatus in the embodiments of the present invention by using a surface-mount DFB laser as an example. The surface-mount DFB laser includes:

a DFB laser with a deeply etched cavity surface, where the DFB laser is located on a front part of the surface-mount laser apparatus and includes an active layer, a ridge waveguide, a deeply etched front cavity surface and a deeply etched back cavity surface, a P-type metal bonding pad, a silicon nitride (SiN) dielectric antireflective film, and a metal reflector, and the ridge waveguide uses a periodic rectangular groove structure and forms a distributed feedback Bragg grating, so that the DFB laser has potential of single longitudinal mode output and has a relatively high side mode suppression ratio;

a butt-coupling area, where the butt-coupling area is located on a back part of the DFB laser with a deeply etched cavity surface, and is a SiO2 dielectric that does not have a waveguide structure and that has a length of 2 um;

a passive waveguide area, where the passive waveguide area is located on a back part of the butt-coupling area, is of a strip waveguide structure formed by downwardly etching SiN, and is covered by the SiO2 dielectric;

a detector area, where the detector area is located on a back part of the foregoing passive waveguide area and includes a deeply etched mesa and a deeply etched cavity surface, the deeply etched cavity surface has a height of approximately 4 um, an oblique ridge waveguide fabricated on an InP material is connected to the foregoing passive waveguide, which allows light to meet a refraction law on a boundary surface between the oblique ridge waveguide and the foregoing passive waveguide. In addition, a dielectric film on the ridge waveguide is removed and the ridge waveguide is covered by a layer of metal that is used as an electrode of a detector; and an N-type metal bonding pad area, where the N-type metal bonding pad area is located on the left of the foregoing detector and includes a deeply etched mesa, a dielectric film on the mesa is removed, and the mesa is covered by a layer of metal that is used as another electrode of the detector and an electrode of the laser.

Fifty surface-mount laser apparatuses are fabricated on a wafer. During fabrication, first, a DFB laser and a waveguide detector may be simultaneously fabricated a III-V semiconductor substrate of the wafer; then, cavity surfaces of the DFB laser and the waveguide detector may be fabricated by using a deep etching technology; next, a passive waveguide made of a material whose refractive index is less than a refractive index of a III-V semiconductor material is fabricated between an on-chip laser and the waveguide detector, and the on-chip laser is butt-coupled with the passive waveguide, the waveguide detector is butt-coupled with the passive waveguide.

After the foregoing fifty surface-mount laser apparatuses are fabricated, the fifty surface-mount laser apparatuses are preliminarily screened. Specifically, for each surface-mount laser apparatus, a probe is made to be in contact with an electrode of the waveguide detector, the on-chip laser outputs test light, the passive waveguide transmits the test light into the waveguide detector, and the waveguide detector detects a photocurrent corresponding to the test light. A surface-mount laser apparatus whose photocurrent is less than 0.1 mA is considered to be unqualified, and the unqualified surface-mount laser apparatus is discarded. Finally, forty qualified surface-mount laser apparatuses are screened out, the wafer is cut to obtain the forty qualified surface-mount laser apparatuses, and then monitoring is performed on an output optical power of each apparatus. Specifically, the apparatus is flip-chip bonded onto a PLC, an electrode of the on-chip laser is directly welded to an electrode that is on the PLC and that is connected to the laser, and the electrode of the waveguide detector is directly welded to an electrode that is on the PLC and that is connected to the waveguide detector. An external circuit provides, by using the electrodes on the PLC, a positive bias voltage to the on-chip laser and a negative bias voltage to the waveguide detector. In this case, the on-chip laser outputs test light, and the test light is butt-coupled into the passive waveguide. The passive waveguide couples 95% of the test light into an optical waveguide of the PLC by using an evanescent wave, and the 95% of the test light is coupled and output by using an optical fiber. A power meter detects, at an output end, that an optical power is 1 mW; while rest test light, that is, 5% of the test light, continues being transmitted in the passive waveguide to be coupled into the waveguide detector. In this case, a photocurrent detected by the waveguide detector is 0.1 mA. A correspondence between the photocurrent and the optical power is recorded, and then an output power of the on-chip laser is adjusted. The foregoing steps are repeated to obtain the following correspondence shown in Table 1.

TABLE 1

| Photocurrent (mA) | 0.1 | 0.2 | 0.3 | 0.4 | 0.5 | 0.6 | 0.7 | 0.8 | 0.9 |
|---|---|---|---|---|---|---|---|---|---|
| Optical power (mW) | 1 | 2 | 3 | 4 | 5 | 6 | 7 | 8 | 9 |

A correspondence between a photocurrent and an optical power of each surface-mount laser apparatus is obtained by means of testing in the foregoing manner. According to the correspondence, after packaging is completed, locking of the output optical power can be implemented by directly using the waveguide detector of the surface-mount laser apparatus. For example, a correspondence between a photocurrent and an optical power of a surface-mount laser apparatus is shown in Table 1. After packaging of the surface-mount laser apparatus is completed and a 3 mW power needs to be output, only an input current of an on-chip laser needs to be adjusted to make a photocurrent of a waveguide detector displayed as 0.3 mA, to ensure that a final output power of an entire device is 3 mW.

Figure 5:
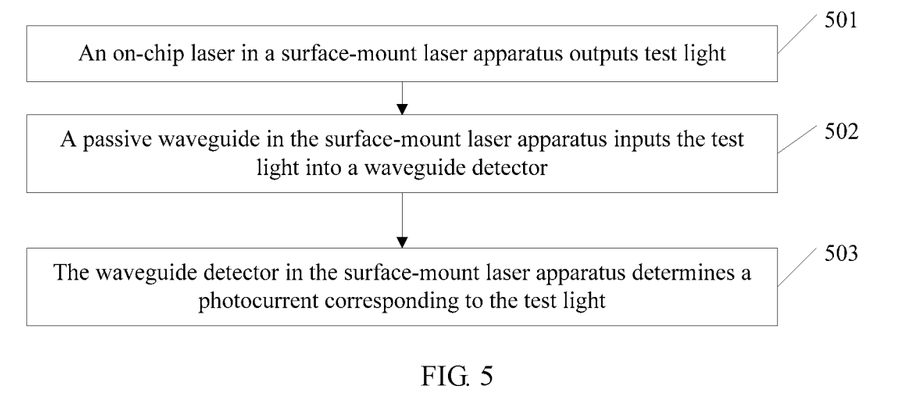
FIG. 5 is a flowchart of an embodiment of an output optical power monitoring method of a surface-mount laser apparatus according to the embodiments of the present invention.

The foregoing describes the surface-mount laser apparatus in the embodiments of the present invention, and the following describes an output optical power monitoring method of a surface-mount laser apparatus in the embodiments of the present invention. Referring to FIG. 5, an embodiment of the output optical power monitoring method of the surface-mount laser apparatus in the embodiments of the present invention includes the following steps.

501. An on-chip laser in the surface-mount laser apparatus outputs test light.

In this embodiment of the present invention, the surface-mount laser apparatus includes the on-chip laser, a passive waveguide, and a waveguide detector. After the surface-mount laser apparatus is fabricated on a wafer, a probe is made to be in contact with an electrode of the waveguide detector to perform photoelectricity testing, and a positive bias voltage is provided to the on-chip laser by using an external circuit. In this case, the on-chip laser outputs the test light.

502. A passive waveguide in the surface-mount laser apparatus inputs the test light into a waveguide detector.

The on-chip laser of the surface-mount laser apparatus is connected to the passive waveguide by means of coupling. After the on-chip laser outputs the test light, the test light is butt-coupled into the passive waveguide, and the passive waveguide inputs the test light into the waveguide detector.

503. The waveguide detector in the surface-mount laser apparatus determines a photocurrent corresponding to the test light.

After the test light arrives at the waveguide detector, the waveguide detector can detect the photocurrent corresponding to the test light, and the photocurrent is used to determine whether an output power of the on-chip laser meets a criterion.

It should be understood that because a loss of the test light is generated due to butt-coupling, the test light output from the laser in this embodiment of the present invention cannot be totally coupled into the waveguide detector, and there is a deviation between a theoretical optical power corresponding to the photocurrent tested by the waveguide detector and an actual optical power of the test light output from the on-chip laser, so the theoretical optical power cannot be used as an absolute measurement criterion of the output optical power of the on-chip laser. However, in this embodiment of the present invention, the photocurrent detected by the waveguide detector can be used to determine whether the output power of the on-chip laser meets the criterion. Specifically, a qualified photocurrent value may be set according to experimental data. When a value of the photocurrent detected by the detector is less than the qualified photocurrent value that is set, it is considered that the surface-mount laser apparatus does not meet a criterion.

The waveguide detector in this embodiment of the present invention can detect the photocurrent of the test light output from the on-chip laser. According to the photocurrent, it can be determined whether the output power of the on-chip laser meets the criterion, that is, testing can be performed on a wafer to screen out an unqualified surface-mount laser apparatus, thereby simplifying detection operations and reducing costs.

In addition to the foregoing output optical power monitoring method of the surface-mount laser apparatus, the embodiments of the present invention provide another output optical power monitoring method of a surface-mount laser apparatus. Referring to FIG. 5, another embodiment of the output optical power monitoring method of the surface-mount laser apparatus in the embodiments of the present invention includes the following steps.

Figure 6:
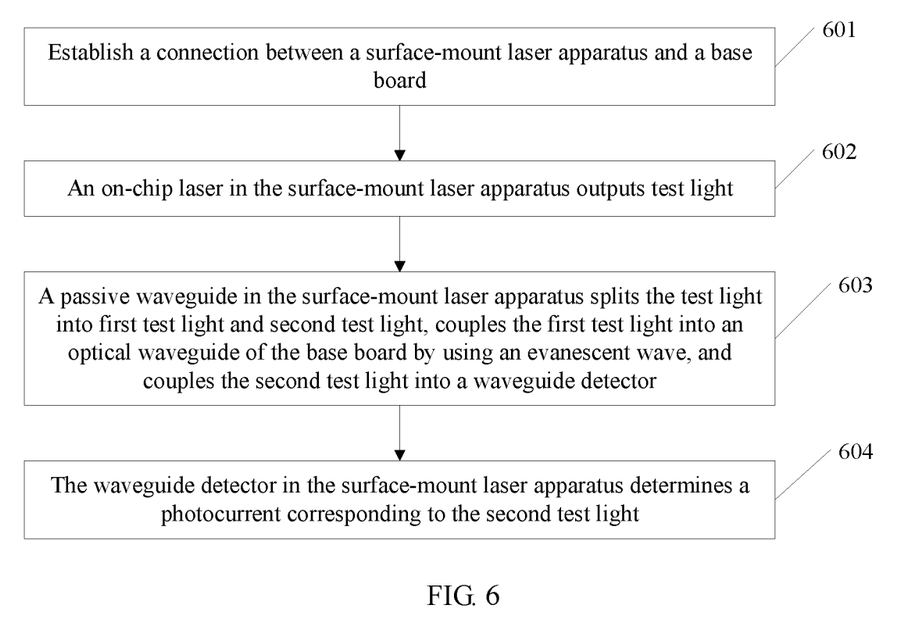
FIG. 6 is a flowchart of another embodiment of an output optical power monitoring method of a surface-mount laser apparatus according to the embodiments of the present invention.

601. Establish a connection between the surface-mount laser apparatus and a base board.

In this embodiment of the present invention, the surface-mount laser apparatus includes an on-chip laser, a passive waveguide, and a waveguide detector. The surface-mount laser apparatus is flip-chip bonded onto the base board. Specifically, in the surface-mount laser apparatus, an electrode of the on-chip laser is directly welded to an electrode that is on the base board and that is connected to the laser, and an electrode of the waveguide detector is directly welded to an electrode that is on the base board and that is connected to the detector. It should be understood that the base board may be a PLC, may be a Si optical device, or may be another base board including an optical waveguide or a chip, and no specific limitation is set herein.

602. An on-chip laser in the surface-mount laser apparatus outputs test light.

After the surface-mount laser apparatus is connected to the base board in the foregoing manner, an external circuit can provide a positive bias voltage to the on-chip laser in the surface-mount laser apparatus by using the electrode on the base board, and the on-chip laser can output test light.

603. The passive waveguide in the surface-mount laser apparatus splits the test light into first test light and second test light, couples the first test light into an optical waveguide of the base board by using an evanescent wave, and couples the second test light into a waveguide detector.

After the on-chip laser outputs the test light, the test light is butt-coupled into the passive waveguide, and the passive waveguide splits the test light into the first test light and the second test light, couples the first test light into the optical waveguide of the base board by using the evanescent wave, and couples the second test light into the waveguide detector.

A ratio of optical energy of the first test light to optical energy of the second test light depends on a slope, a width, or another parameter of the passive waveguide, that is, a split ratio used during evanescent wave coupling may be controlled by designing a parameter of the passive waveguide. The split ratio used during the evanescent wave coupling is a ratio of the optical energy of the first test light to the optical energy of the second test light. In actual application, the optical energy ratio is relatively high, that is, a quite large portion of the test light is coupled into the optical waveguide of the base board, and the rest small portion of the light is coupled into the waveguide detector. Specifically, the split ratio is set to 95:5. Certainly, the split ratio may be another ratio, and no specific limitation is set herein.

It should be noted that after being coupled into the optical waveguide of the base board by using the evanescent wave, the first test light can be coupled and output by using an optical fiber or a lens or in another manner, and an optical power of the output light is detected at an output end by using a device that can detect a power, such as a power meter.

604. The waveguide detector in the surface-mount laser apparatus determines a photocurrent corresponding to the second test light.

After the second test light is butt-coupled into the waveguide detector by using the passive waveguide, the waveguide detector operates in a negative bias state, the waveguide detector detects the photocurrent corresponding to the second test light. The photocurrent is corresponding to a target optical power, and the target optical power is an optical power, detected by the foregoing device after the first test light is output from the optical waveguide of the base board, of the first test light. During subsequent use of the surface-mount laser apparatus, when the target optical power needs to be output, an operating current of the on-chip laser may be adjusted according to a correspondence between the photocurrent and the optical power, so that the photocurrent of the waveguide detector is equal to a photocurrent value corresponding to the target value. In this case, light whose optical power is the target value is finally output from the base board.

The surface-mount laser apparatus in the embodiments of the present invention includes the on-chip laser, the passive waveguide, and the waveguide detector. After the surface-mount laser apparatus is connected to the base board, the external circuit can provide a voltage to the on-chip laser by using the electrode on the base board, so that the laser radiates the test light. The test light is butt-coupled into the passive waveguide. The passive waveguide couples a large portion of the test light into the optical waveguide of the base board by using the evanescent wave, and couples a small portion of the test light into the waveguide detector. According to the correspondence between the photocurrent detected by the waveguide detector and the optical power output from the optical waveguide on the base board, locking of the output optical power can be implemented without using an external detector, thereby reducing light path complexity and production costs of a device.

It may be clearly understood by persons skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, that is, the parts displayed as units may be located in one position, or may be distributed on a plurality of network units. Some or all of the units may be selected according to actual requirements to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in each embodiment of the present invention. The foregoing storage medium includes: any medium that can store program code, such as a USB flash drive, a read-only memory (ROM), a random access memory (RAM), a magnetic disk, or an optical disc.

The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A surface-mount laser apparatus, comprising:
   an on-chip laser,
   a single passive waveguide, and
   a waveguide detector, wherein:
   the waveguide detector comprises: a first ridge waveguide, and an electrode, wherein the electrode is configured to connect to a bonding pad on a base board, wherein the base board comprises an optical waveguide; and the on-chip laser comprises a second ridge waveguide; and the on-chip laser is configured to output test light;

the single passive waveguide is configured to:
split the test light into first test light and second test light, wherein optical energy of the first test light is higher than optical energy of the second test light;
couple the first test light into the optical waveguide of the base board, wherein the first test light is output from the optical waveguide of the base board; and
couple the second test light directly into the waveguide detector; and the waveguide detector is configured to determine, using the electrode, a photocurrent corresponding to the second test light, wherein the photocurrent is corresponding to optical power of the first test light detected after the first test light is output from the optical waveguide of the base board;

wherein the on-chip laser is coupled with the single passive waveguide by the second ridge waveguide; and wherein the waveguide detector is coupled with the single passive waveguide by the first ridge waveguide.

2. The surface-mount laser apparatus according to claim 1, wherein
the first test light is coupled into the optical waveguide of the base board by using an evanescent wave.

3. The surface-mount laser apparatus according to claim 2, wherein the first ridge waveguide is covered by metal, and wherein the metal is used as the electrode of the waveguide detector.

4. The surface-mount laser apparatus according to claim 1, wherein
the waveguide detector further comprises a deeply etched cavity surface.

5. The surface-mount laser apparatus according to claim 4, wherein
the deeply etched cavity surface is covered by a dense substance with a preset thickness.

6. The surface-mount laser apparatus according to claim 4, wherein the deeply etched cavity surface is a straight surface or an arc surface.

7. The surface-mount laser apparatus according to claim 1, wherein
an included angle between the first ridge waveguide of the waveguide detector and the second ridge waveguide of the on-chip laser is within a preset range; and
the single passive waveguide comprises a curved waveguide.

\* \* \* \* \*